(12) United States Patent
Filler et al.

(10) Patent No.: US 12,402,340 B2
(45) Date of Patent: Aug. 26, 2025

(54) CHEMICAL ETCHING METHODS FOR FABRICATING NANOSTRUCTURES

(71) Applicant: Georgia Tech Research Corporation, Atlanta, GA (US)

(72) Inventors: Michael A. Filler, Atlanta, GA (US); Eric Vogel, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 1007 days.

(21) Appl. No.: 17/286,024

(22) PCT Filed: Oct. 18, 2019

(86) PCT No.: PCT/US2019/056899
§ 371 (c)(1),
(2) Date: Apr. 16, 2021

(87) PCT Pub. No.: WO2020/081912
PCT Pub. Date: Apr. 23, 2020

(65) Prior Publication Data
US 2021/0384317 A1    Dec. 9, 2021

Related U.S. Application Data

(60) Provisional application No. 62/747,196, filed on Oct. 18, 2018.

(51) Int. Cl.
*H10D 30/01*    (2025.01)
*H01L 21/02*    (2006.01)
(Continued)

(52) U.S. Cl.
CPC ..... *H10D 30/014* (2025.01); *H01L 21/02532* (2013.01); *H01L 21/02603* (2013.01);
(Continued)

(58) Field of Classification Search
CPC ......... H01L 29/66439; H01L 21/02532; H01L 21/02603; H01L 21/30604; H01L 21/308;
(Continued)

(56) References Cited

U.S. PATENT DOCUMENTS 5,899,734 A * 5/1999 Lee ..................... H10D 30/025
                                              438/758
7,741,197 B1   6/2010 Duan et al.
(Continued)

FOREIGN PATENT DOCUMENTS

WO    1992/21652    5/1999
WO    2008074862   6/2008

OTHER PUBLICATIONS

Search Report from European Application No. 19874664.8 dated Nov. 28, 2022.
(Continued)

*Primary Examiner* — Latanya N Crawford Eason
(74) *Attorney, Agent, or Firm* — Troutman Pepper Locke LLP; Ryan A. Schneider; Carter B. Hale (57) ABSTRACT

A method of chemically etching, comprising: providing a base layer, the base layer comprising a first section and a second section, the first section comprising a first material, the second section comprising a second material; providing a resist layer, wherein a first portion of the resist layer covers at least a portion of the first section of the base layer, and wherein a second portion of the resist layer covers at least a portion of the second section of the base layer; and exposing the first and second portions of the resist layer to a first chemical etchant, such that the first chemical etchant migrates through the first portion of the resist layer to react with the first material of the first section of the base layer and removes the first portion of the resist layer, and such that the second portion of the resist layer is not removed.

18 Claims, 8 Drawing Sheets

(51) Int. Cl.
*H01L 21/306* (2006.01)
*H01L 21/308* (2006.01)
*H10D 30/43* (2025.01)
*H10D 30/67* (2025.01)
*H10D 62/10* (2025.01)

(52) U.S. Cl.
CPC ...... *H01L 21/30604* (2013.01); *H01L 21/308* (2013.01); *H10D 30/031* (2025.01); *H10D 30/43* (2025.01); *H10D 30/6728* (2025.01); *H10D 30/6735* (2025.01); *H10D 30/6757* (2025.01); *H10D 62/122* (2025.01)

(58) Field of Classification Search
CPC ........... H01L 29/0676; H01L 29/42392; H01L 29/66742; H01L 29/775; H01L 29/78642; H01L 29/78696; H01L 21/04; B82Y 40/00; B82Y 10/00; H10D 30/014; H10D 30/031; H10D 30/43; H10D 30/6728; H10D 30/6735; H10D 30/6757; H10D 30/674; H10D 30/501; H10D 30/59; H10D 62/122
See application file for complete search history.

(56) References Cited

U.S. PATENT DOCUMENTS

| | | | |
|---|---|---|---|
| 10,361,284 B2* | 7/2019 | Wernersson | H01L 29/66469 |
| 2005/0227391 A1 | 10/2005 | Jin et al. | |
| 2008/0246021 A1* | 10/2008 | Suk | H01L 29/7613 257/E29.322 |
| 2011/0291190 A1* | 12/2011 | Xiao | H01L 21/31133 257/E21.409 |
| 2012/0021918 A1* | 1/2012 | Bashir | B82Y 15/00 257/253 |
| 2014/0353591 A1* | 12/2014 | Kim | H01L 29/775 257/29 |
| 2015/0024559 A1 | 1/2015 | Xiao | |
| 2015/0053925 A1* | 2/2015 | Liu | G01N 27/4145 438/49 |
| 2015/0179781 A1* | 6/2015 | Chang | H01L 29/7848 438/151 |
| 2015/0303065 A1* | 10/2015 | Buckalew | H01L 24/03 204/275.1 |
| 2016/0172237 A1* | 6/2016 | Bristol | H01L 21/76834 257/773 |
| 2016/0293772 A1 | 10/2016 | Xiao | |
| 2017/0194213 A1 | 7/2017 | Ching et al. | |
| 2017/0330958 A1 | 11/2017 | Coquand et al. | |
| 2018/0090336 A1 | 3/2018 | Li et al. | |
| 2018/0219084 A1* | 8/2018 | Wernersson | H01L 29/66666 |

OTHER PUBLICATIONS

International Search Report and Written Opinion from Application No. PCT/US2019/056899 dated Jan. 9, 2020.

* cited by examiner

CHEMICAL ETCHING METHODS FOR FABRICATING NANOSTRUCTURES

CROSS-REFERENCE TO RELATED APPLICATIONS

This application claims the benefit of U.S. Provisional Application Ser. No. 62/747,196, filed on Oct. 18, 2018, which is incorporated herein by reference in its entirety as if fully set forth below.

TECHNICAL FIELD OF THE INVENTION

The various embodiments of the present disclosure relate generally to chemical etching methods. More particularly, the various embodiments of the present invention are directed to chemical etching methods for making nanostructures.

BACKGROUND OF THE INVENTION

Figure 2:
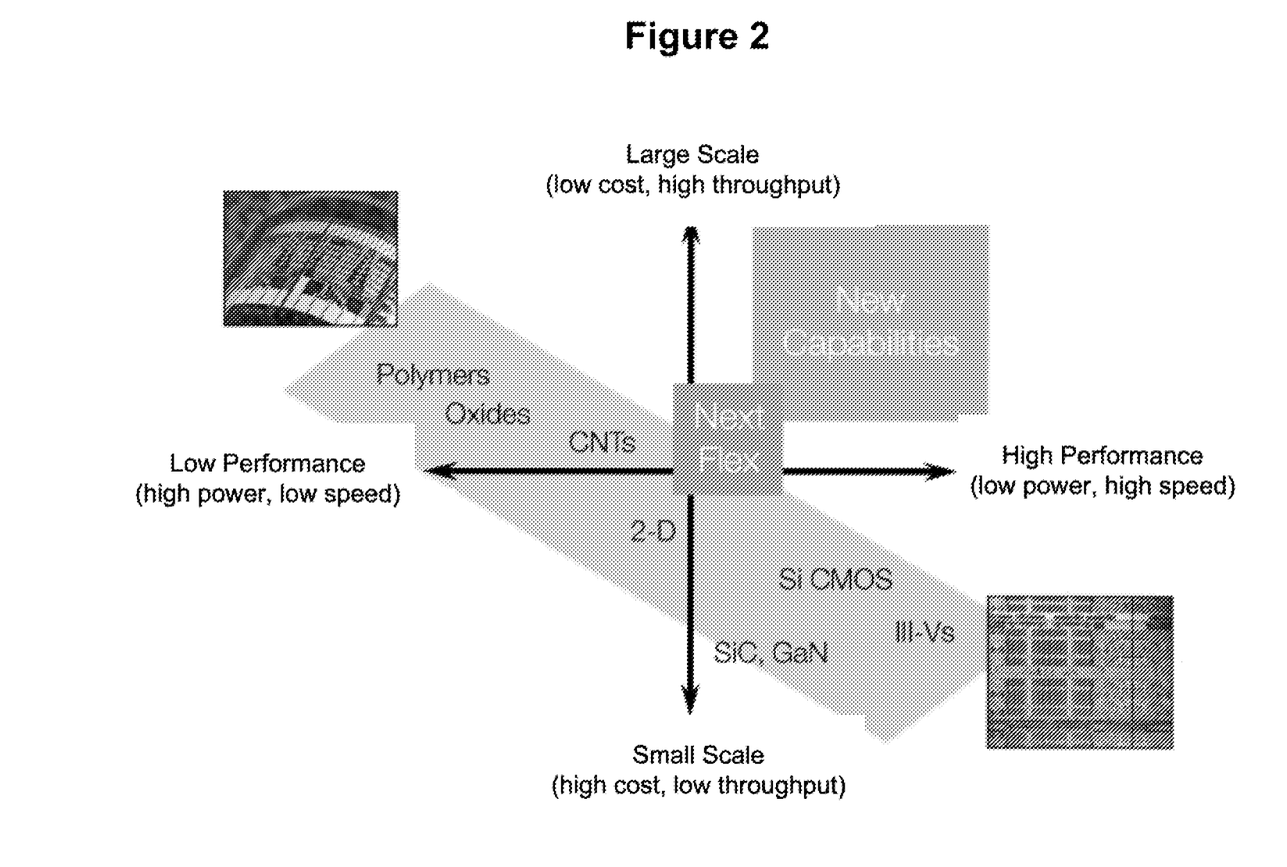
FIG. 2 illustrates the trade-off between integrated circuit performance and achievable manufacturing rate.

Long-imagined technologies such as wireless "smart dust" or computers that can be embedded in or on any material are unlikely to become reality without a fundamentally new integrated circuit manufacturing platform. FIG. 2 shows the present and long-standing trade-off between device performance and manufacturing scale. Devices generally either exhibit (i) high performance and limited production scale or (ii) poor performance and, in principle, large production scale. However, the applications mentioned above require devices that fall squarely into the first and currently inaccessible quadrant of the plot in FIG. 2. Device speeds and power efficiencies must rival wafer-based technologies, but at costs orders of magnitude lower and manufacturing throughputs orders of magnitude higher than are possible today. The need for multiple circuit functionalities, including computation, data storage, sensing, wireless communication, and energy harvesting, further necessitates the seamless incorporation and interconnection of heterogeneous materials and device types.

Existing fabrication schemes are underpinned by one or more physicochemical processes that are, at their foundation, incommensurate with the above requirements. Wafer-based methods are limited by the slow rates of near-equilibrium crystal growth and top-down photolithographic feature definition. The monolithic integration of structurally and functionally diverse materials remains a challenge. Heterogeneous integration techniques, such as wafer bonding and template assisted selective epitaxy, while enabling some additional functionality, remain wafer-based and therefore unlikely to achieve the desired throughputs. Roll-to-roll techniques utilizing organics, thin films, or nanocrystals, while being better-suited for high throughput, are stymied by the poor mobilities of disordered materials. Even if ordered materials were possible on flexible substrates, the speed, precision, and ultimate resolution of "high throughput" patterning techniques like ink jet printing will likely remain limited by the complex behavior of materials and fluids within highly confined volumes and under large shears.

Therefore, there is a desire for highly scalable methods for manufacturing transistors and other nano- and microstructures and devices. Various embodiments of the present invention address these desires.

BRIEF SUMMARY OF THE INVENTION

The present invention relates generally to chemical etching methods, and more particularly to bottom-up masking enabled by resist application and chemical etching. An exemplary embodiment of the present invention provides a method of chemically etching, comprising: providing a base layer, the base layer comprising a first section and a second section, the first section comprising a first material, the second section comprising a second material; providing a resist layer, wherein a first portion of the resist layer covers at least a portion of the first section of the base layer, and wherein a second portion of the resist layer covers at least a portion of the second section of the base layer; exposing the first and second portions of the resist layer to a first chemical etchant, such that the first chemical etchant migrates through the first portion of the resist layer to react with the first material of the first section of the base layer and removes the first portion of the resist layer, and such that the second portion of the resist layer is not removed.

In any of the embodiments disclosed herein, the base layer can comprise a semiconductor material.

In any of the embodiments disclosed herein, the first material can comprise a p-type semiconductor and the second material can comprise an n-type semiconductor.

In any of the embodiments disclosed herein, the first material can comprise an n-type semiconductor and the second material can comprise a p-type semiconductor.

In any of the embodiments disclosed herein, the base layer can further comprise a third section comprising the first material, wherein providing the resist layer can comprise providing a third portion of the resist layer over at least a portion of the third section of the base layer, and wherein exposing the resist layer to the first chemical etchant can remove the third portion of the resist layer.

In any of the embodiments disclosed herein, the base layer can further comprise a third section comprising the second material, wherein providing the resist layer can comprise providing a third portion of the resist layer over at least a portion of the third section of the base layer, and wherein exposing the resist layer to the first chemical etchant may not remove the third portion of the resist layer.

In any of the embodiments disclosed herein, the resist layer can comprise a polymer.

In any of the embodiments disclosed herein, the resist layer can comprise a polymer that can be chemically bonded to the based layer.

In any of the embodiments disclosed herein, the resist layer can comprise a polymer chosen such that it a surface of the base layer does not oxidize.

In any of the embodiments disclosed herein, the first chemical etchant can be chemically compatible with the resist layer, such that at least a portion of the chemical etchant can migrate through the resist layer.

In any of the embodiments disclosed herein, the first chemical etchant can be a liquid or a gas.

In any of the embodiments disclosed herein, the method can further comprise, after exposing the first and second portions of the resist layer to the first chemical etchant to remove the first portion of the resist layer over the first section of the base layer, depositing a third material over the first section of the base layer.

In any of the embodiments disclosed herein, the method can further comprise depositing a fourth material over the third material.

In any of the embodiments disclosed herein, the method can further comprise removing the second portion of the resist layer.

In any of the embodiments disclosed herein, the third material can be an oxide.

In any of the embodiments disclosed herein, the fourth material can be a metal.

In any of the embodiments disclosed herein, exposing the first and second portions of the resist layer to the first chemical etchant, such that the first chemical etchant reacts with the resist layer and the first material of the first section of the base layer to remove the first portion of the resist layer, may not include a step of photolithography.

In any of the embodiments disclosed herein, the base layer can be a nanostructure.

In any of the embodiments disclosed herein, the base layer can be a nanostructure that is a nanowire.

In any of the embodiments disclosed herein, the base layer can be a microstructure.

In any of the embodiments disclosed herein, the base layer can be a microstructure that is a microwire.

Another embodiment provides a method of making a transistor, comprising: providing a semiconductor nanostructure, comprising a first section comprising a first material, a second section comprising the first material, and a third section between the first and second sections, the third section comprising a second material; providing a resist layer over the nanostructure, the resist layer comprising a first portion over the first section of the nanostructure, a second portion over the second section of the nanostructure, and a third portion over the third section of the nanostructure; exposing the first, second, and third portions of the resist layer to a first chemical etchant, wherein the first chemical etchant reacts with the third section of the nanostructure to remove the third portion of the resist layer, wherein the first chemical etchant does not remove the first and second portions of the resist layer.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. Further, while one or more embodiments may be discussed as having certain advantageous features, one or more of such features may also be used with the various embodiments of the invention discussed herein. In similar fashion, while exemplary embodiments may be discussed below as device, system, or method embodiments, it is to be understood that such exemplary embodiments can be implemented in various materials, devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

DETAILED DESCRIPTION OF THE INVENTION

To facilitate an understanding of the principles and features of the present invention, various illustrative embodiments are explained below. To simplify and clarify explanation, the invention is described below as applied to manufacturing transistors. One skilled in the art will recognize, however, that the invention is not so limited. Instead, as those skilled in the art would understand, the various embodiments of the present invention also find application in other areas, including, but not limited to, manufacturing many types of nano- and microstructures and devices, including, but not limited to, resistors, capacitors, diodes, and the like.

The components, steps, and materials described hereinafter as making up various elements of the invention are intended to be illustrative and not restrictive. Many suitable components, steps, and materials that would perform the same or similar functions as the components, steps, and materials described herein are intended to be embraced within the scope of the invention. Such other components, steps, and materials not described herein can include, but are not limited to, similar components or steps that are developed after development of the invention.

Conventional transistor manufacturing techniques rely on photolithography. Specifically, a photomask is used to direct the etching of specific locations during the manufacturing process. Accordingly, some embodiments of the present invention provide manufacturing techniques that do not require photolithography, thus simplifying the manufacturing process and reducing costs.

Embodiments of the present invention can make use of a bottom-up masking process that combines resist application with a novel chemical etching process. The chemical etching process uses a chemical etchant that can react with a base material through a resist layer to selectively remove the portion of that resist layer adjacent the base material. Thus, in cases where the base layer is made of multiple sections of different materials (e.g., a first section made of a first material and a second section made of a second material), a resist layer can be applied to the entirety of the base layer (i.e., both sections), and a chemical etchant can be selected such that the portion of the resist layer adjacent the first section of the base layer is removed, but the portion of the resist layer adjacent the second section is left substantially intact. Accordingly, because the etching is a function of the properties of the underlying base layer (and chemical etchant), the process simplifies the masking of and thus manufacture of semiconductor nano- and microstructures and devices.

Figure 1:
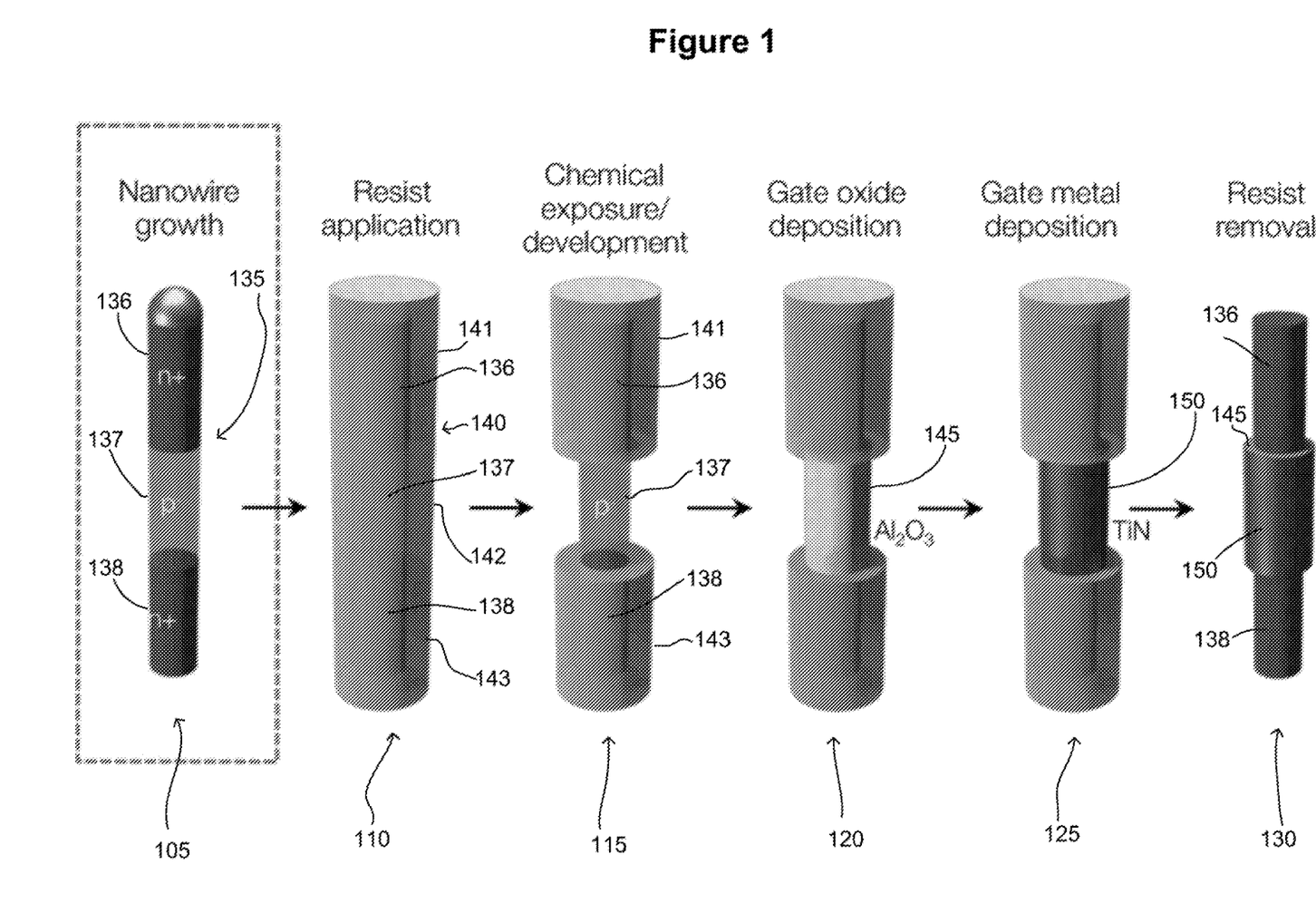
FIG. 1 provides a method of manufacturing a transistor using a chemical etching process, in accordance with an exemplary embodiment of the present invention.

As shown in FIG. 1, an exemplary embodiment of the present invention provides a—method of manufacturing a transistor using a chemical etching process. The process begins with a base layer 135. The base layer 135 can be many different structures, including, but not limited to, a nanostructure, a nanowire, a microstructure, a microwire, and the like. As shown in FIG. 1, the base layer 135 is a nanowire. As used herein, the term nanostructure means a structure with at least one dimension (e.g., height, length, thickness, diameter, etc.) that is less than one micron. As used herein, the term nanowire means a cylindrically- or prismatically-shaped (e.g., hexagonal prism) structure having a diameter less than one micron. As used herein, the term microstructure means a structure with at least one dimension (e.g., height, length, thickness, diameter, etc.) that is less than one millimeter. As used herein, the term microwire means a cylindrically-shaped structure having a diameter less than one millimeter.

The base layer 135 can comprise multiple sections made of different materials. For example, the base layer 135 shown in FIG. 1 includes a first section 136, a second section 137, and a third section 138. In some embodiments, one or more of the sections of the base layer can be made of the same material. In some embodiments, the base layer can be made of semiconductor materials, including, but not limited to, silicon, germanium, and the like. For example, in FIG. 1, the first section 136 comprises an n-type semiconductor material (e.g., n-doped silicon), the second section 137 comprises a p-type semiconductor material (e.g., p-doped silicon), and the third section 138 also comprises an n-type semiconductor material (e.g., n-doped silicon).

The method then proceeds to step 110 where a resist layer 140 is provided over the base layer. The resist layer 140 can be applied via many processes known in the art. For example, in some embodiments can be applied via a liquid or gas process. The resist layer 140 can cover a portion of or the entirety of the base layer 135. As shown in FIG. 1, the resist layer 140 covers the entirety of the base layer 135. The resist layer 140 can also include multiple portions. For example, as shown in FIG. 1, the resist layer 140 can include a first portion 141 covering the first section 136 of the base layer 135, a second portion 142 covering the second section 137 of the base layer 135, and a third portion 143 covering the third section 138 of the base layer 135. The resist layer can be made of many different materials. In some embodiments, each portion of the resist later is made of the same material. In some embodiments, different portions of the resist layer can comprise different materials. In some embodiments, the resist layer 140 comprises a polymer. The polymer can be chemically bonded to the base layer 135. The resist layer, e.g., polymer, can be chosen such that application of the resist layer does not modify the base layer 135, e.g., the base layer doesn't oxidize, and selective chemical etching is maintained. Exemplary polymers that can be used include, but are not limited to, polymethyl methacrylate (PMMA), polystyrene, polyethylene oxide (PEO), polyethylene glycol (PEG), polynorborene, and the like.

The process then proceeds to step 115 wherein the structure is exposed to a chemical etchant. The chemical etchant migrates through the resist layer 140. The chemical etchant then reacts with the material in the second section 137 of the base layer 135. The reaction results in the second portion 142 of the resist layer 140 being removed, but the first 141 and third 143 portions of the resist layer are not removed. Though small amounts of the second portion 142 of the resist layer may remain, the majority of the second portion is removed. Additionally, though small amounts of the first and third portions 141 143 may be removed, the majority of the first and third portions remains, as shown in FIG. 1. In step 115, one or more portions of the resist layer 140 can be removed without employing photolithography.

Although step 115 in FIG. 1 illustrates that only the second portion 142 of the resist layer 140 is removed, in other embodiments, other portions of the resist layer 140 may be removed in addition to or alternatively to the second portion 142. As discussed above, which portions of the resist layer that are removed by the chemical etching step are dependent at least in part on the material of the base layer, specifically the reaction between the chemical etchant and the material in a particular section of the base layer 135.

The chemical etchant can be selected to cause the reaction with the material of a section of the base layer to cause the portion of the resist layer to be removed. Additionally, the chemical etchant can be selected such it is chemically compatible with the material of the resist layer, meaning the chemical etchant can migrate through the resist layer to react with the base layer. In some embodiments, the chemical etchant is a liquid. In some embodiments, the chemical etchant is a gas. The chemical etchant can be many different chemical etchants, including, but not limited to, potassium hydroxide (KOH), hydrogen peroxide, hydrofluoric acid, and the like.

The method then proceeds to step 120 where a material 145 is deposited over the second section 137 where the section portion 142 of the resist layer was removed. In some embodiments, as shown in FIG. 1, step 120 is a gate oxide deposition step, such that an oxide material 145 is deposited over the second section 137 of the base layer. The oxide material 145 can be many oxides known in the art, including, but not limited to, aluminum oxide, hafnium oxide, silicon dioxide, and the like.

The method then proceeds to step 125 where another material 150 is deposited over the material 145. In some embodiments, as shown in FIG. 1, step 125 is a gate metal deposition step, such that a metal 150 is deposited over the material 145. The metal 150 can be many metals known in the art, including, but not limited to, titanium nitride, platinum, aluminum, and the like. In some embodiments, step 120 is optional, such that material 150, which can be a metal, is deposited over the second section 137 of the base layer, without first depositing material 145.

The method then proceeds to step 130 where remaining portions of the resist layer can be removed. The remaining portions of the resist layer can be removed by many different methods known in the art. The result of step 130 is a transistor, e.g. a MOSFET, manufactured without requiring photolithography.

EXAMPLE

An exemplary fabrication process employing a bottom-up masking process to manufacture a MOSFET will now be described. The process is generally shown in FIG. 1. While the final device structure comprises a three-segment nanowire (i.e., source-channel-drain), the ability to easily create more complex, user-programmable nanowire structures, such as the nanowire shown in FIG. 3, allows more complex structures and devices to be fabricated.

Nanowire Synthesis. A bottom-up catalytic epitaxy nanowire growth process was used to obtain a starting structure. Catalytic epitaxy (also known as the vapor-liquid-solid mechanism) is schematically illustrated in FIG. 4. It is driven by a semiconductor-metal alloy liquid catalyst droplet that collects semiconductor atoms delivered from impinging precursor gases. When the semiconductor atoms in the catalyst surpass a critical supersaturation, a solid nanowire precipitates from the catalyst and continues to grow via a repeated sequence of nucleation near the trijunction (i.e., where the vapor, liquid, and solid nanowire meet) and subsequent step flow across the liquid-solid interface. Catalytic epitaxy provides a number of advantages. The use of a liquid metal seed particle enables crystal formation at temperatures as much as several hundred degrees lower than conventional CVD by lowering activation barriers to precursor decomposition and crystallization. Crystal composition can be modulated axially by changes to the gas phase composition. Dopant profile (e.g., n/p) or heterostructures (e.g., Si/Ge) can therefore be programmed along the 1-D crystal's length, as will be leveraged for the patterning process, as demonstrated in FIG. 3. In addition, the short radial direction inherent to the 1-D geometry allows for the efficient accommodation of strain. This feature enables compositions beyond that possible in the bulk and/or defect-free heterostructures even for cases where lattice or thermal expansion mismatch is large. Demonstrations of quantum structures, superlattices, and a plethora of device types, underscore the potential of catalytic epitaxy, as well as the general benefits of 1-D geometries for defect tolerance and control. Characterizing an entirely bottom-up fabricated, all-Si MOSFET, as described here, would facilitate the production of more exotic materials and combinations that catalytic epitaxy enables, such as III-V nanowires and heterostructures for even higher performance devices.

Nanowire growth occurred in the range of 400° C.$<T_{substrate}<$500° C. and 1 Torr$<P_{precursor}<10^2$ Torr. Metallic nanoparticles were used to seed the catalytic epitaxy process. Au was selected due to its well-established growth characteristics and its straightforward removal from the nanowire tip following growth with aqua regia and/or triiodide solution.

Figure 6:
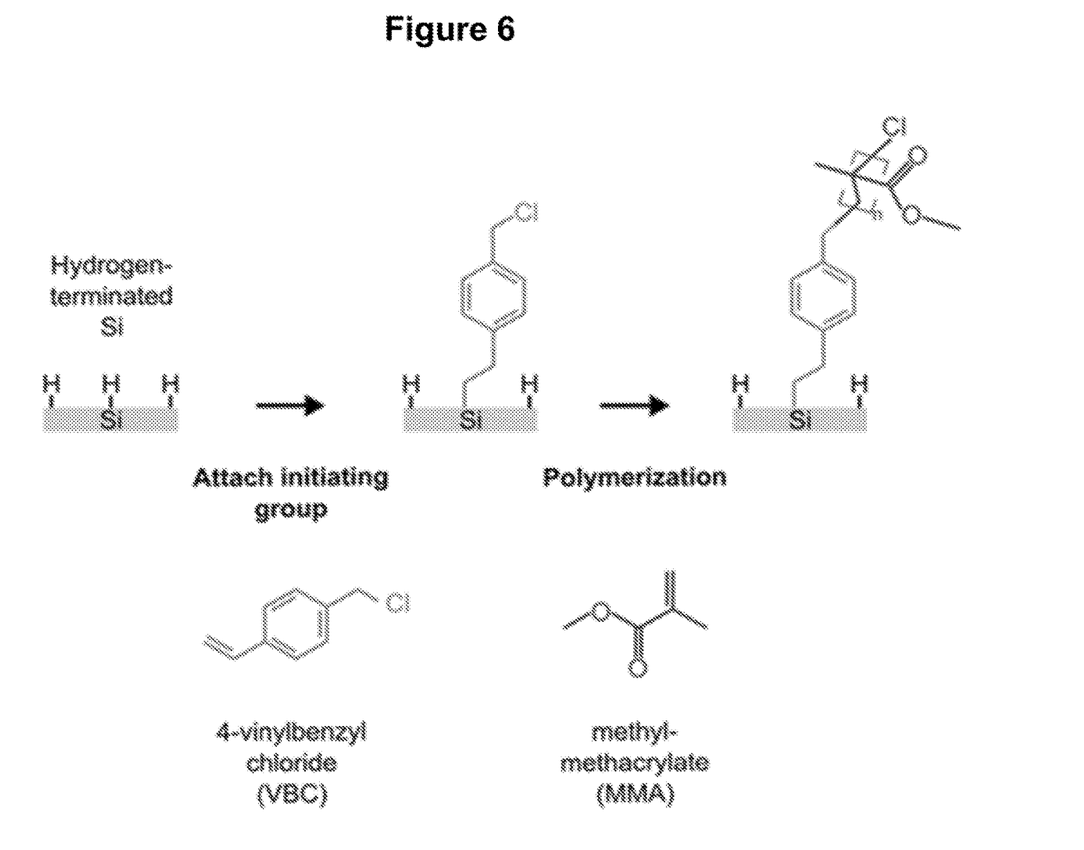
FIG. 6 illustrates polymer brush chemistry used to coat a nanowire, as used in some exemplary embodiments of the present invention.
Figure 7A:
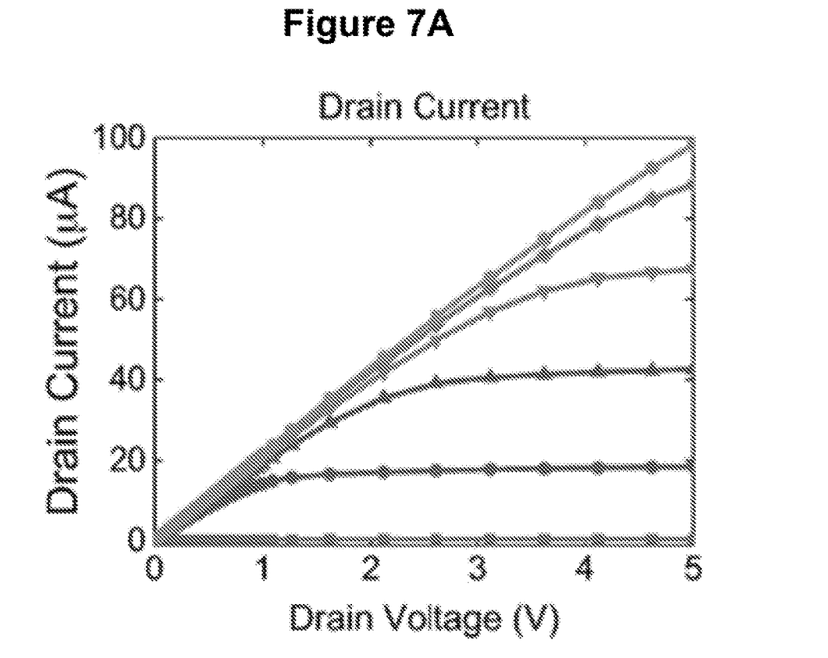
FIG. 7A provides a plot of drain current vs. voltage at different gate voltages for exemplary n-MOSFETs.
Figure 7B:
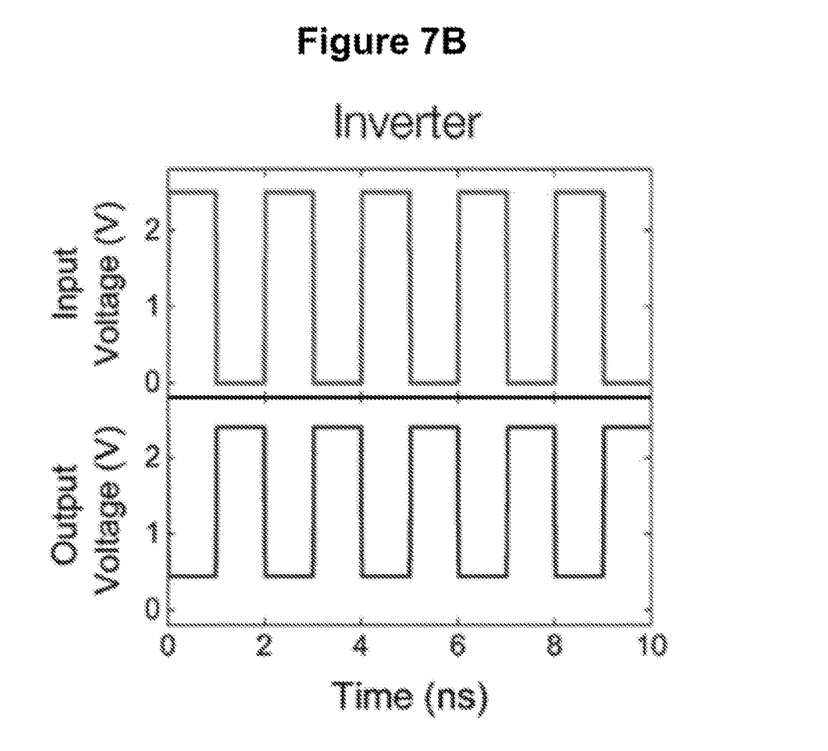
FIG. 7B provides a plot of the performance of an exemplary n-MOSFET inverter.

Nanowire masking. Masking of the nanowire surface to enable the construction of a gate stack without top-down lithography was then performed, as demonstrated FIG. 3. The process takes advantage of the chemical differences of different segments of the nanowire to selectively remove a polymer and, in doing so, expose certain regions for subsequent deposition. A polymer brush was first polymerized from the surface of the nanowire. The polymerization procedure is illustrated in FIG. 6 and briefly described here. As-grown Si nanowires with a desired axial dopant profile (e.g., $n^{++}$ source, $p^-$ channel, $n^{++}$ drain) were initially rinsed in buffered oxide etch (BOE) to remove the native oxide and add a hydrogen termination. A hydrosilylation reaction was then carried out in mesitylene to attach the polymerization initiator, 4-vinylbenzylchloride (VBC), to the entire nanowire surface. A poly(methyl methacrylate) (PMMA) brush was then grown via atom transfer radical polymerization (ATRP) from the surface-attached VBC initiator. ATRP is advantageous because the mechanism of polymerization minimizes crosslinking. The reaction was carried out at 100° C. in N—N-dimethylformamide (DMF) with standard copper(I) bromide (CuBr), 2,2'-bipyridine (bpy), and copper(II) bromide ($CuBr_2$) catalyst. After this step, the nanowires are uniformly and conformally coated with PMMA (FIG. 3C).

Figure 3:
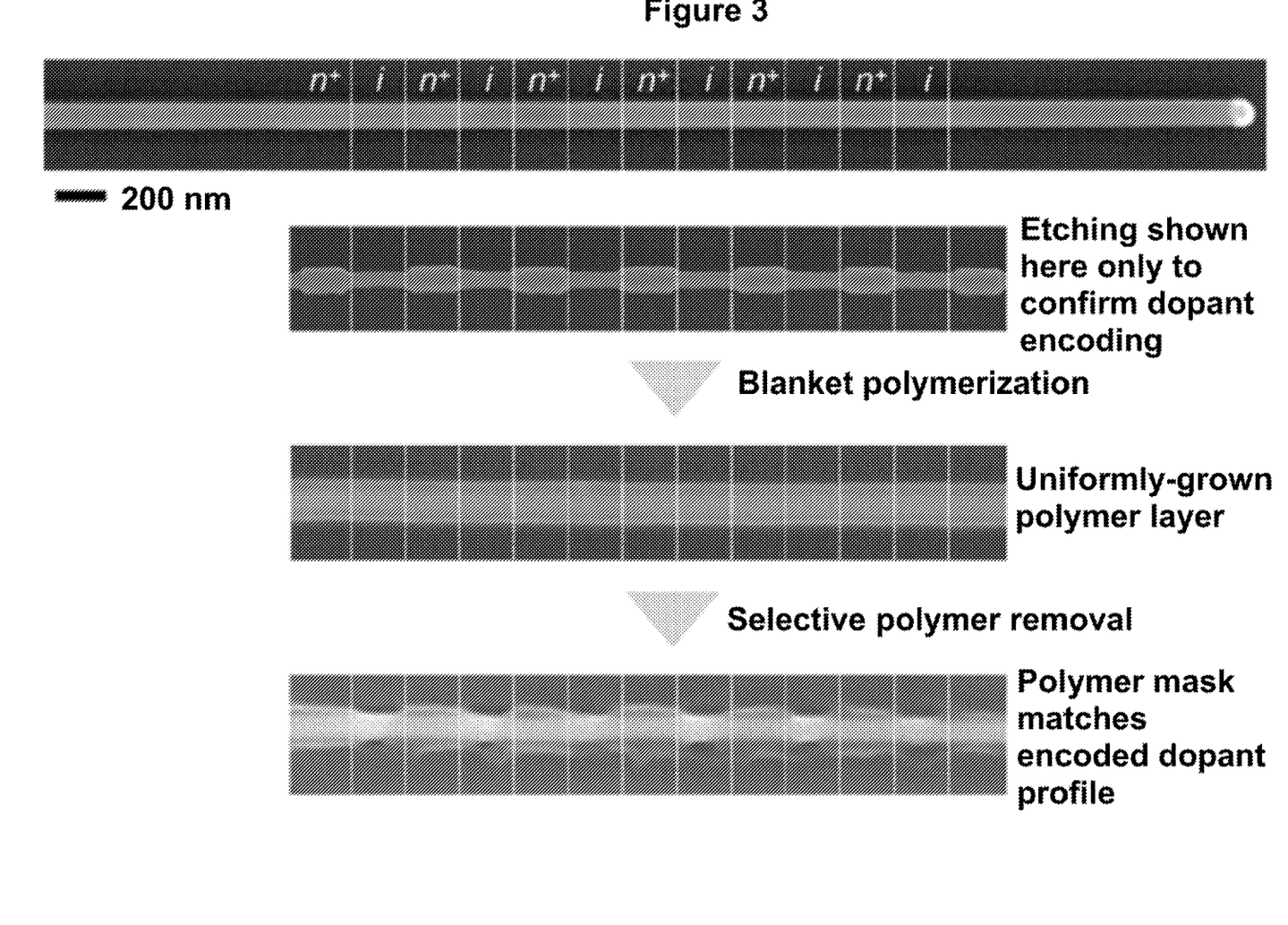
FIG. 3 illustrates surface-initiated polymerization of PMMA on Si nanowire surfaces and its selective removal, as used in some exemplary embodiments of the present invention.
Figure 4:
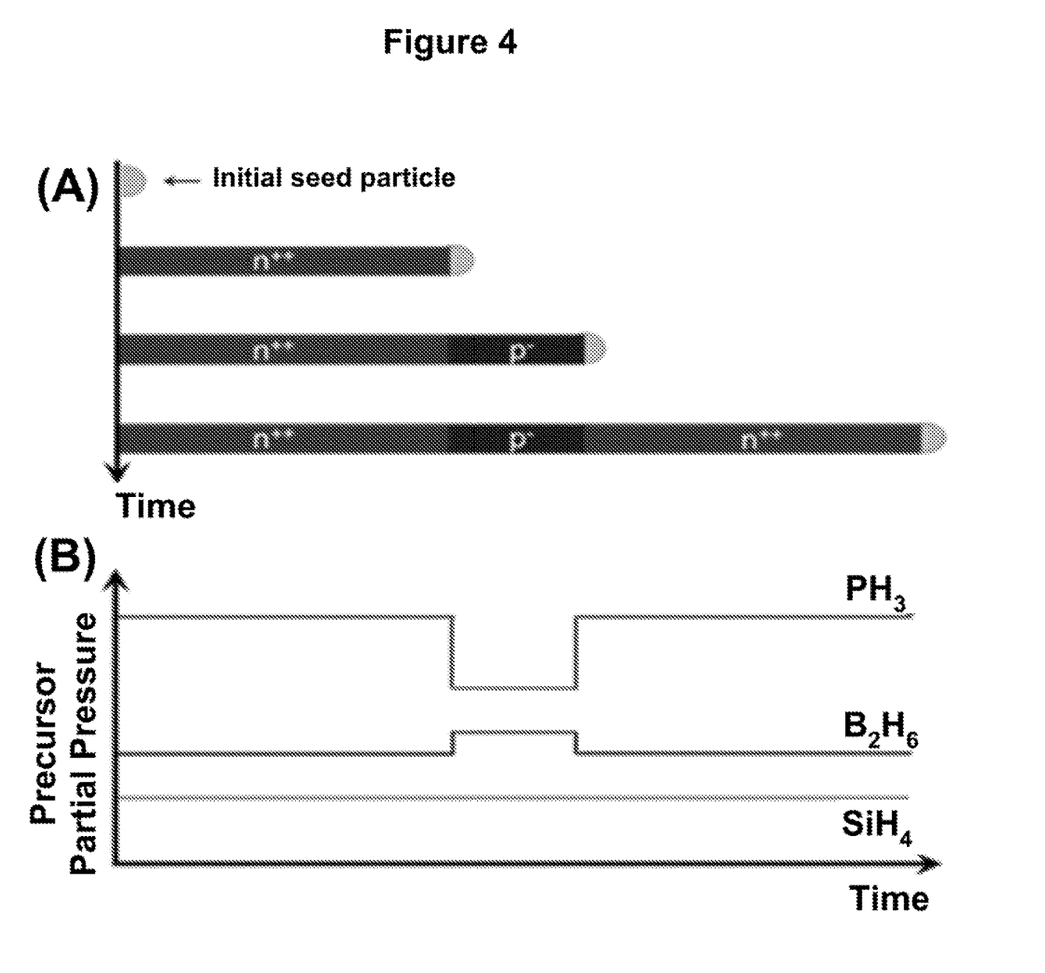
FIG. 4 illustrates a process of growing a nanowire, as used in some exemplary embodiments of the present invention.
Figure 5:
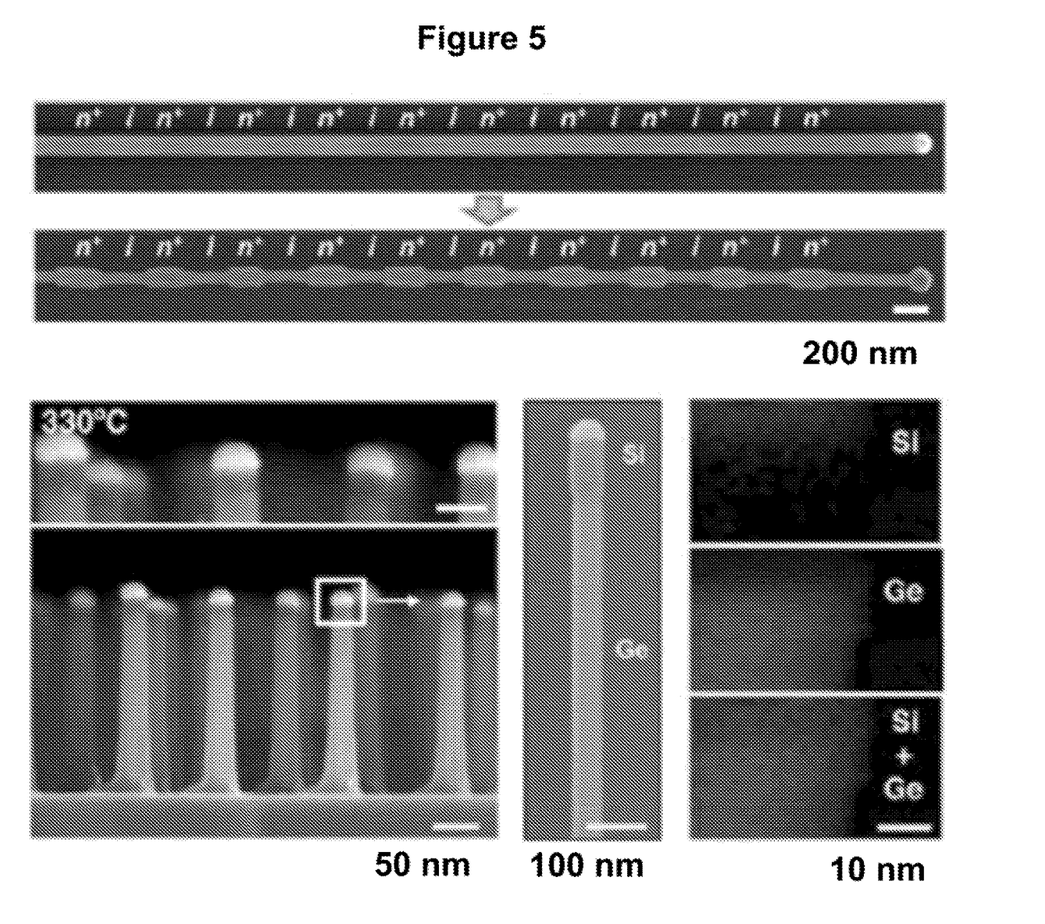
FIG. 5 provides examples of the dopant profiles (top) and heterostructures (bottom), used in some exemplary embodiments of the present invention.
Figure 8:
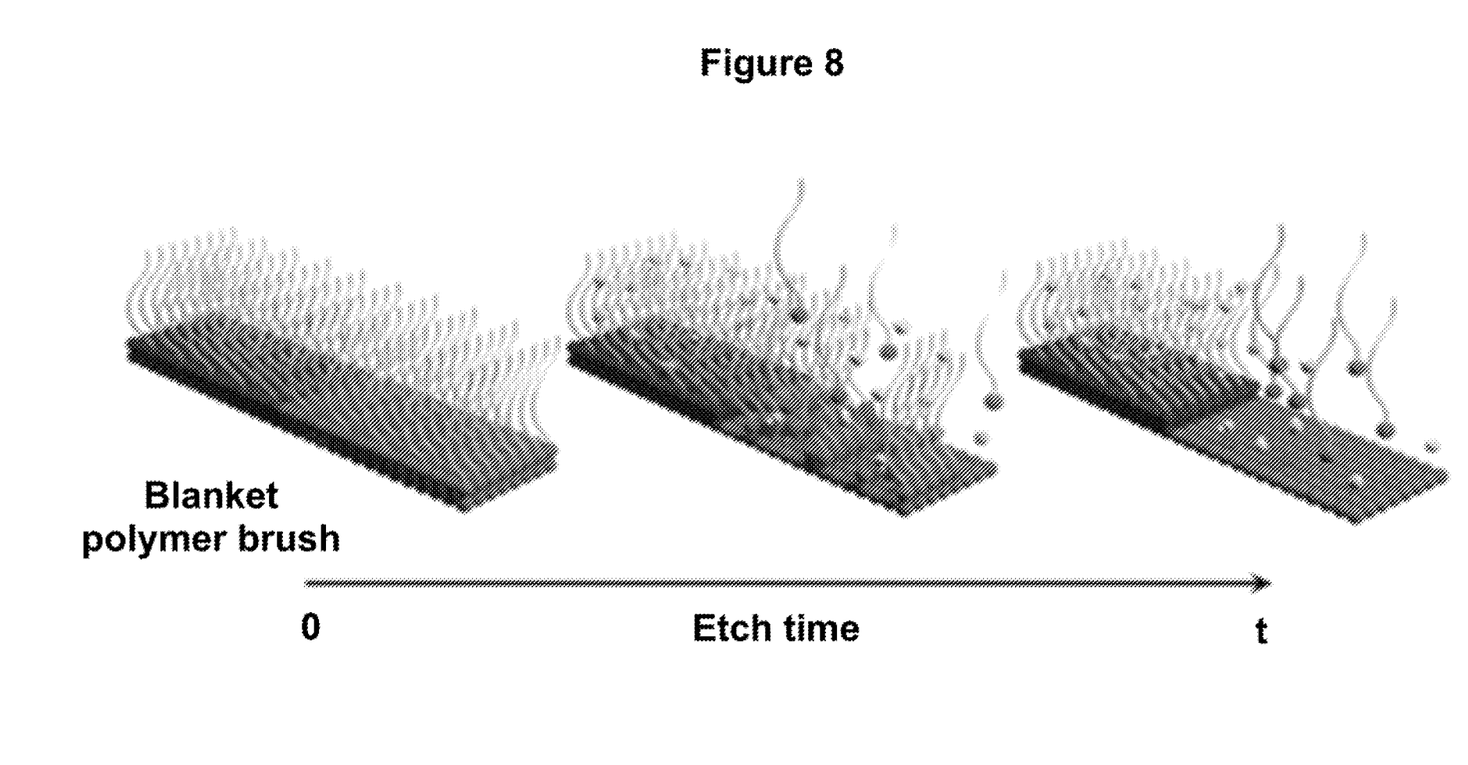
FIG. 8 illustrates a selective polymer removal process, as used in some exemplary embodiments of the present invention.

A post-polymerization selective etch in aqueous KOH removed the polymer brush only attached to the lightly-doped regions of the nanowire (FIG. 3D). The hypothesized degrafting mechanism of the polymer removal is shown in FIG. 8. The etchant first diffuses through the polymer and then attacks the underlying Si. Because the polymer brush is tethered directly to the Si surface via a Si—C bond, etching of Si atoms also detaches the polymer brush. It is desirable for the etchant and polymer to be chemically compatible. In other words, for the case of PMMA and aqueous KOH, PMMA is sufficiently hydrophilic that the KOH is allowed to penetrate to the semiconductor surface. The etch time can be selected to maximize the selectivity of Si atom etching in the lightly-doped vs. heavily-doped regions. Under etching fails to remove the polymer brush while over etching removes the polymer brush everywhere. However, the etch rate selectivity between undoped and doped sections can be quite high—exceeding 1000 for the dopant concentrations utilized here.

The chemical etching process can be applicable to any situation where a polymerization initiator can be chemically attached to the surface, where a polymer brush can be grown from it, and for which selective etch chemistries exist. Importantly, the generality of the process provides a number of routes to a viable mask. If PMMA proves inadequate for masking ALD of the gate stack, despite its successful use in the process (FIG. 3), a number of other potentially suitable polymers can also be synthesized via ATRP. Si/Ge wafers as well as nanowire heterostructures can also be masked. In this case, differences in the etch chemistry of $SiO_x$ and $GeO_x$ can be leveraged to provide the necessary etch selectivity.

Area-selective deposition of a self-aligned gate stack. The gate dielectric and metal can be selectively deposited on the channel using atomic layer deposition (ALD) after masking the source/drain regions. ALD is widely utilized to deposit dielectrics and metals in state-of-the-art Si ICs and permits conformal coatings on 3-D nanoscale objects. A variety of area-selective ALD processes have also been developed in recent years. These processes rely on differences in surface chemistry to favor/disfavor deposition on certain regions of a substrate. Polymers and self-assembled monolayers (SAMs) can both be used as blocking layers.

A $Al_2O_3$/TiN gate stack can be used for the Si nanowire device. $Al_2O_3$ exhibits a modest dielectric constant ($\kappa$=9) and a large band offset with Si, which minimizes leakage current. TiN is low resistance mid-gap metal with a post-deposition tunable workfunction that makes it suitable for both n- and p-MOSFETs. These metal-oxide-semiconductor (MOS) capacitors can be fabricated on c-Si wafers with an ALD $Al_2O_3$ dielectric. These capacitors exhibit a (negative) fixed charge density in the ~$10^{12}$ $cm^{-2}$ range and an interface state density ~$10^{11}$ $cm^{-2}$ range, which support the ability of ALD to yield films appropriate for high-performance devices. $HfO_2$ and Pt, both of which are routinely deposited via ALD, are alternate choices for constructing the gate stack.

The specifications of the polymer used for masking during the process and the gate stack deposition were distinct. The chemical etching process can use a polymer mask and selective etchant that are chemically compatible, while it is desirable for the polymer mask to resist transport of and chemical reaction with ALD precursors. While some polymers may be sufficiently compatible with both steps, post-process "hardening" treatment may be used to improve the mask's chemical, thermal, and transport resistance to ALD precursors.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other materials, structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. Instead, it is intended that the invention is defined by the claims appended hereto.

What is claimed is:

1. A photolithography-free method of fabricating a component comprising:
   chemically attaching a thickness of a resist layer on at least a portion of a compositionally heterogeneous base layer comprising a first section and a second section different than the first section, wherein the first section comprises at least one of a first composition profile and a first material, wherein the second section comprises at least one of a second composition profile and a second material, and wherein the first composition profile is different than the second composition profile; and
   selectively etching the base layer with a chemical etchant that migrates through the thickness of the resist layer, the selective etching based upon the compositional heterogeneity of the base layer;
   wherein the chemical etchant is selected to react with the first section of the base layer; and
   wherein the selective etching of the base layer leads to a removal of at least a portion of the thickness of the resist layer previously chemically attached to the first section of the base layer via the reaction between the chemical etchant and the first section, and leads to a maintenance of at least a portion of the thickness of the resist layer chemically attached to second section of the base layer.

2. The method of claim 1, wherein the base layer comprises a semiconductor material.

3. The method of claim 2, wherein the first material comprises one of a p-type semiconductor and an n-type semiconductor; and
   wherein the second material comprises the other of the p-type semiconductor and the n-type semiconductor.

4. A photolithography-free method of fabricating a component comprising:
   chemically attaching a resist layer on a compositionally heterogeneous base layer, the resist layer having a thickness defined from a base face in contact with the base layer to an opposing exposed face distal the base layer; and
   exposing the exposed face of the resist layer to a chemical etchant chemically compatible with the resist layer;
   wherein the chemical compatibility provides for the chemical etchant to migrate through the thickness of the resist layer from the exposed face to the base face, during which migration the resist layer remains chemically attached to the base layer;
   wherein upon migration through the resist layer, the chemical etchant selectively etches portions of the base layer, the portions based upon the compositional heterogeneity of the base layer, such that the chemical etchant:
   reacts with a first section of the base layer covered by the resist layer, that results in the selective removal of a first portion of the thickness of the resist layer previously chemically attached to the first section of the base layer; and
   although migrating through the resist layer to a second section of the base layer, selectively maintains the chemical attachment of a second portion of the thickness of the resist layer to the second section of the base layer different than the first section.

5. The method of claim 4, wherein the base layer comprises a single-crystal Si nanowire;
   wherein the first section comprises a channel; and
   wherein the second section comprises one of a source and a drain.

6. A photolithography-free method of fabricating a component comprising:
   a bottom-up process of growing a compositionally heterogeneous base layer having nanoscale features;
   applying a thickness of a resist layer on the base layer having a first section comprising a first material and a second section comprising a second material, wherein a first portion of the resist layer covers at least a portion of the first section of the base layer, and wherein a second portion of the resist layer covers at least a portion of the second section of the base layer; and
   exposing an outer surface of the resist layer to a chemical etchant chemically compatible with the resist layer such that:
   the chemical etchant migrates through the thickness of the first portion of the resist layer to react with the first material of the first section of the base layer, and as a result, selectively removes the thickness of the first portion of the resist layer from the first section of the base layer; and
   the chemical etchant migrates through the thickness of the second portion of the resist layer without removing the second material of the second section of the base layer, and as a result, the second portion of the resist layer is not removed, and remains chemically attached to the second section of the base layer.

7. The method of claim 6, wherein the applying comprises chemically bonding the resist layer to the base layer.

8. The method of claim 6 further comprising depositing a third material over the first section of the base layer where the first portion of the resist layer was selectively removed.

9. The method of claim 8 further comprising depositing a fourth material over the third material.

10. The method of claim 9, wherein the third material is an oxide; and
wherein the fourth material is a metal.

11. The method of claim 6, wherein the base layer is selected from the group consisting of a nanostructure, a nanowire, a microstructure, and a microwire.

12. A photolithography-free method comprising:
a bottom-up process of synthesizing a base layer via catalytic epitaxy, the base layer comprising consecutively and alternating portions of a first material and a second material different from the first material;
coating a resist layer on the base layer, the base layer comprising a first section, a mid section, and a second section;
wherein:
the first section comprises a first dopant profile and at least a first material;
the mid section comprises a second dopant profile different than the first dopant profile and a second material different than the first material; and
the second section comprises the first dopant profile and the at least first material;
exposing the resist layer to a chemical etchant that:
is chemically compatible with the resist layer;
etches the mid section of the base layer; and
does not etch the first and second sections of the base layer;
wherein the chemical etchant migrates through the resist layer, reacts with the mid section of the base layer, and as a result selectively removes at least a portion of the resist layer previously coating the mid section of the base layer, and selectively maintains at least portions of the resist layer coating the first section and the second section of the base layer;
depositing a third material over at least a portion of the mid section of the base layer where the resist layer was selectively removed;
depositing a fourth material over at least a portion of the third material; and
removing at least a portion of the resist layer previously coating the first section and the second section of the base layer.

13. The method of claim 12, wherein the first material comprises an n-type semiconductor; and
wherein the second material comprises a p-type semiconductor.

14. The method of claim 12, wherein: the first material comprises Si;
the second material comprises Ge;
the first dopant profile comprises an $n^{++}$ doping profile; and
the second dopant profile comprises a $p^-$ doping profile.

15. A method comprising:
fabricating nanoscale electronic devices; and
adaptively interconnecting the fabricated nanoscale electronic devices to form functional circuitry;
wherein each nanoscale electronic device is fabricated by the method of claim 12 after removing all portions of the resist layer previously applied to the first section and the second section of the base layer.

16. A photolithography-free method of fabricating a component comprising:
a bottom-up synthesized nanowire comprising an axially positioned first section and a second section different than the first section, wherein the first section comprises at least one of a first composition profile and a first material, wherein the second section comprises at least one of a second composition profile and a second material, and wherein the first composition profile is different than the second composition profile;
chemically attaching a resist layer around the nanowire; and
exposing the resist-covered nanowire to a chemical etchant that:
diffuses through the resist layer;
is reactive with at least a portion of the first section of the nanowire; and
is inactive with at least a portion the second section of the nanowire;
wherein the reactivity results in at least a portion of the resist layer chemically attached to the first section of the nanowire becoming chemically unattached from the first section of the nanowire, and removed; and
wherein the inactivity results in at least a portion of the resist layer chemically attached to the second section of the nanowire to remain chemically attached to the second section of the nanowire, and maintained.

17. The method of claim 16, wherein the resist layer is selected from a group consisting of molecular and organic.

18. The method of claim 16, wherein the resist layer is selected from a group consisting of a self-assembled monolayer and a polymer brush.

* * * * *